(12) United States Patent
Kim et al.

(10) Patent No.: US 9,171,764 B2
(45) Date of Patent: Oct. 27, 2015

(54) METHODS FOR FABRICATING INTEGRATED CIRCUITS USING SELF-ALIGNED QUADRUPLE PATTERNING

(71) Applicant: GLOBALFOUNDRIES, Inc., Grand Cayman, KY (US)

(72) Inventors: Ryan Ryoung Han Kim, Albany, NY (US); Jason Cantone, Mechanicville, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 17 days.

(21) Appl. No.: 14/106,347

(22) Filed: Dec. 13, 2013

(65) Prior Publication Data

US 2015/0170973 A1 Jun. 18, 2015

(51) Int. Cl.
| | | |
|---|---|---|
| *H01L 21/311* | (2006.01) | |
| *H01L 21/8238* | (2006.01) | |
| *H01L 27/11* | (2006.01) | |
| *H01L 21/306* | (2006.01) | |
| *H01L 21/308* | (2006.01) | |

(52) U.S. Cl.
CPC .... *H01L 21/823821* (2013.01); *H01L 21/3083* (2013.01); *H01L 21/30604* (2013.01); *H01L 27/1104* (2013.01)

(58) Field of Classification Search
CPC .......................... H01L 21/0337; H01L 21/546
See application file for complete search history.

(56) References Cited

U.S. PATENT DOCUMENTS

| | | | | |
|---|---|---|---|---|
| 8,324,036 | B2 * | 12/2012 | Cheng et al. ................... | 438/165 |
| 8,513,131 | B2 * | 8/2013 | Cai et al. ........................ | 438/696 |
| 8,786,019 | B2 * | 7/2014 | Wu et al. ........................ | 257/347 |
| 8,863,063 | B2 * | 10/2014 | Becker et al. ................. | 716/118 |
| 8,906,757 | B2 * | 12/2014 | Kim et al. ...................... | 438/163 |

* cited by examiner

*Primary Examiner* — Zandra Smith
*Assistant Examiner* — Andre'C Stevenson
(74) *Attorney, Agent, or Firm* — Ingrassia Fisher & Lorenz, P.C.

(57) ABSTRACT

Methods for fabricating integrated circuits and for forming masks for fabricating integrated circuits are provided. In an embodiment, a method for fabricating an integrated circuit includes etching an upper mandrel layer to form upper mandrels. At least one upper mandrel has a first critical dimension and at least one upper mandrel has a second critical dimension not equal to the first critical dimension. The method further includes forming upper spacers adjacent the upper mandrels and etching a lower mandrel layer using the upper spacers as an etch mask to form lower mandrels. The method also includes forming lower spacers adjacent the lower mandrels and etching a material using the lower spacers as an etch mask to form variably spaced structures.

20 Claims, 4 Drawing Sheets

METHODS FOR FABRICATING INTEGRATED CIRCUITS USING SELF-ALIGNED QUADRUPLE PATTERNING

TECHNICAL FIELD

The technical field generally relates to methods for fabricating integrated circuits, and more particularly relates to methods for fabricating integrated circuits using self-aligned quadruple patterning to form variably spaced structures.

BACKGROUND

Fin-type field effect transistors (FinFETs) have emerged as an effective approach to support the scaling of integrated circuits, as FinFETs require less area than planar transistors. FinFETs utilize fin structures of semiconductor material that function as channels for the FinFETs. Fin structures may be formed in logic areas and memory areas on a semiconductor substrate through general semiconductor patterning processes.

The continued scaling of integrated circuits has generated a demand for methods for forming nanometer-sized features, such as fin structures, that are separated by nanometer-sized distances. As the limits of optical resolution are approached in current lithography processes, double patterning processes have been used to create critical dimensions (CD) and spaces that are beyond the capability of a single lithography step. Specifically, while a conventional lithographic process can be used to form a line-width equal to a minimum critical dimension associated with the lithographic process, a double patterning process can be used to form a line-width smaller than the minimum critical dimension. Double patterning techniques include "pitch split" (also called litho-etch litho-etch, or LELE) and self-aligned double patterning (SADP), also called sidewall image transfer (SIT).

To obtain even smaller feature sizes, self-aligned quadruple patterning (SAQP) or double SIT techniques have been proposed for planar transistors. However, the use of self-aligned quadruple patterning to form fin structures is problematic. For example, while fin structures in a logic area and fin structures in an NMOS portion of an SRAM may be formed with a uniform pitch, fin structures in a PMOS portion of an SRAM typically require a different pitch or pitches. In other words, if a single fin structure formation process is used to form the fin structures on a semiconductor substrate, the process may be required to form variably spaced fin structures.

Accordingly, it is desirable to provide methods for fabricating integrated circuits that provide for variably spaced structures. In addition, it is desirable to provide methods for fabricating integrated circuits that use self-aligned quadruple patterning processes to form variably spaced semiconductor fin structures. Furthermore, other desirable features and characteristics will become apparent from the subsequent detailed description and the appended claims, taken in conjunction with the accompanying drawings and the foregoing technical field and background.

BRIEF SUMMARY

Methods for fabricating integrated circuits and for forming masks for fabricating integrated circuits are provided. In accordance with an exemplary embodiment, a method for fabricating an integrated circuit includes etching an upper mandrel layer to form upper mandrels. At least one upper mandrel has a first critical dimension and at least one upper mandrel has a second critical dimension not equal to the first critical dimension. The method further includes forming upper spacers adjacent the upper mandrels and etching a lower mandrel layer using the upper spacers as an etch mask to form lower mandrels. The method also includes forming lower spacers adjacent the lower mandrels and etching a material using the lower spacers as an etch mask to form variably spaced structures.

In another embodiment, a method for fabricating an integrated circuit includes providing a upper mandrel layer overlying a lower mandrel layer overlying a semiconductor material, and performing a self-aligned quadruple patterning (SAQP) process to form variably spaced semiconductor fin structures from the semiconductor material. The self-aligned quadruple patterning process includes etching the upper mandrel layer to form a first upper mandrel having sidewalls and distanced from a second upper mandrel having sidewalls. The first upper mandrel has a first critical dimension is distanced from the second upper mandrel by a second critical dimension not equal to the first critical dimension. The self-aligned quadruple patterning process further includes forming upper spacers adjacent the sidewalls of the upper mandrels, removing the upper mandrels, and etching the lower mandrel layer using the upper spacers as an etch mask to form lower mandrels having sidewalls. The self-aligned quadruple patterning process also includes forming lower spacers adjacent the sidewalls of the lower mandrels, removing the lower mandrels, and etching the semiconductor material using the lower spacers as an etch mask to form the variably spaced semiconductor fin structures.

In accordance with another embodiment, a method for forming a mask for fabricating an integrated circuit is provided. The method includes etching an upper mandrel layer to form upper mandrels having sidewalls. A first upper mandrel has a first critical dimension and a second upper mandrel has a second critical dimension not equal to the first critical dimension. The method includes forming upper spacers adjacent the sidewalls of the upper mandrels, removing the upper mandrels, and etching a lower mandrel layer using the upper spacers as an etch mask to form lower mandrels. Also, the method includes forming lower spacers adjacent the lower mandrels and removing the lower mandrels. The lower spacers define a mask for forming variably spaced structures.

BRIEF DESCRIPTION OF THE DRAWINGS

Embodiments of methods for fabricating integrated circuits using self-aligned quadruple patterning and for forming masks for fabricating integrated circuits will hereinafter be described in conjunction with the following drawing figures, wherein like numerals denote like elements, and wherein.

DETAILED DESCRIPTION

The following detailed description is merely exemplary in nature and is not intended to limit the methods for fabricating integrated circuits using self-aligned quadruple patterning or methods for forming masks for fabricating integrated circuits as claimed herein. Furthermore, there is no intention to be bound by any expressed or implied theory presented in the preceding technical field, background or brief summary, or in the following detailed description.

In accordance with the various embodiments herein, methods for fabricating integrated circuits using self-aligned quadruple patterning techniques and methods for forming masks for fabricating integrated circuits using self-aligned quadruple patterning techniques are provided. The methods described herein provide for forming variably spaced fin structures at reduced feature sizes. Further, the methods allow for forming fin structures in logic areas and in memory areas of an integrated circuit using self-aligned quadruple patterning techniques.

FIGS. 1-11 illustrate steps in accordance with an embodiment of a method for fabricating an integrated circuit 10. Various steps in the design and composition of integrated circuits are well known and so, in the interest of brevity, many conventional steps will only be mentioned briefly herein or will be omitted entirely without providing the known process details. Further, it is noted that integrated circuits include a varying number of components and that single components shown in the illustrations may be representative of multiple components.

Figure 1:
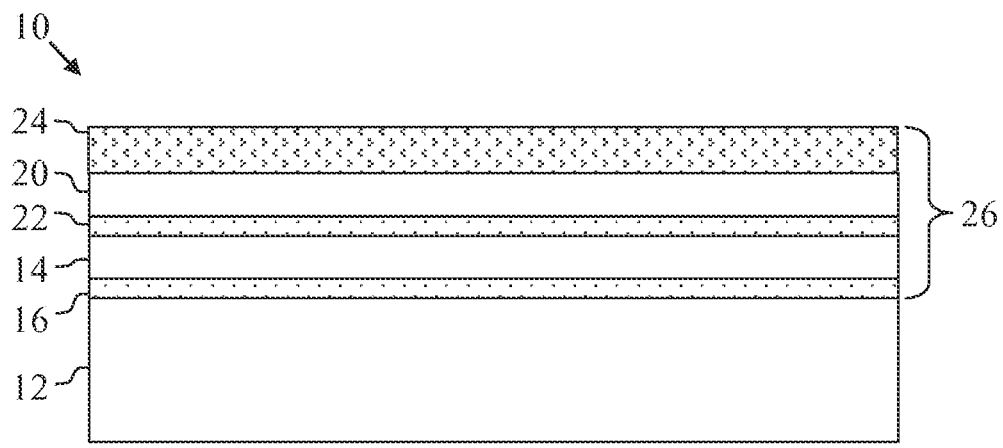
FIG. 1-11 illustrate, in cross section, a portion of an integrated circuit and method steps for fabricating the integrated circuit with a self-aligned quadruple patterning process in accordance with various embodiments herein.

In the exemplary embodiment of FIG. 1, a method for fabricating an integrated circuit 10 includes providing a semiconductor substrate 12. An exemplary semiconductor substrate 12 is formed from semiconductor material such as silicon, including the relatively pure silicon materials typically used in the semiconductor industry as well as silicon admixed with other elements, such as germanium and the like. Alternatively, the semiconductor substrate 12 can be realized as germanium, gallium arsenide, and the like, or the semiconductor substrate 12 can include layers of different semiconductor materials. In an exemplary embodiment the semiconductor substrate 12 is realized as a bulk silicon substrate; however, it may be realized as a silicon-on-insulator (SOI) substrate.

As shown, a lower mandrel layer 14 is formed overlying the semiconductor substrate 12. As used herein "overlying" means "on" and "over". In this regard, the lower mandrel layer 14 may lie directly on the semiconductor substrate 12 such that it makes physical contact with the semiconductor substrate 12 or it may lie over the semiconductor substrate 12 such that another material layer, for example, a hard mask layer 16, is interposed between the semiconductor substrate 12 and the lower mandrel layer 14. Further, as used herein "overlying", "over", "upper", and "lower" describe the orientation and/or location of a feature or element within the consistent but arbitrary frame of reference illustrated by the drawings.

In an exemplary embodiment, the lower mandrel layer 14 is amorphous silicon, polycrystalline silicon, or another material suitable for use in required patterning steps. In an exemplary embodiment, the lower mandrel layer 14 is blanket-deposited by a plasma-enhanced chemical vapor deposition (PECVD) process, a low pressure chemical vapor deposition (LPCVD), or another chemical vapor deposition (CVD) process. An exemplary lower mandrel layer 14 has a thickness of about 80 nanometers (nm) to about 120 nm, such as about 100 nm. An exemplary hard mask layer 16 is deposited silicon nitride, silicon oxide, silicon oxynitride, amorphous carbon, a carbon-doped silica (SiCOH), or another material suitable for the patterning steps of the process. In an exemplary embodiment, the hard mask layer 16 is formed by blanket-deposition using, for example, a plasma-enhanced chemical vapor deposition process, a low pressure chemical vapor deposition, or another chemical vapor deposition process. An exemplary hard mask layer 16 has a thickness of about 25 nm to about 50 nm, such as about 40 nm.

As shown, an upper mandrel layer 20 is formed overlying the lower mandrel layer 14. The upper mandrel layer 20 may lie directly on the lower mandrel layer 14 or it may lie over the lower mandrel layer 14 such that another material layer, for example, a hard mask layer 22, is interposed between the lower mandrel layer 14 and the upper mandrel layer 20. In an exemplary embodiment, the upper mandrel layer 20 is amorphous silicon, polycrystalline silicon, or another material suitable for use in lithography steps. In an exemplary embodiment, the upper mandrel layer 20 is blanket-deposited by a plasma-enhanced chemical vapor deposition process, a low pressure chemical vapor deposition, or another chemical vapor deposition process. An exemplary upper mandrel layer 20 has a thickness of about 80 nm to about 120 nm, such as about 100 nm. An exemplary hard mask layer 22 is deposited silicon nitride, silicon oxide, silicon oxynitride, amorphous carbon, a carbon-doped silica (SiCOH), or another material suitable for the lithography steps of the process. An exemplary hard mask layer 22 is formed by blanket-deposition using, for example, a plasma-enhanced chemical vapor deposition process, a low pressure chemical vapor deposition, or another chemical vapor deposition process. An exemplary hard mask layer 22 has a thickness of about 25 nm to about 50 nm, such as about 40 nm. As further shown, a masking layer 24 may be formed over the upper mandrel layer 20. An exemplary masking layer 24 is photoresist, though another suitable patternable material may be used.

The hard mask layer 16, lower mandrel layer 14, hard mask layer 22, upper mandrel layer 20, and masking layer 24 are considered to form a mask stack 26. The mask stack 26 may include other layers, such as anti-reflective coating layers, etch stop layers, optical dispersive layers, or other desired layers interposed below or over the hard mask layer 16, lower mandrel layer 14, hard mask layer 22, upper mandrel layer 20, or masking layer 24. The mask stack 26 lies over the semiconductor substrate 12 and is processed to form a mask for patterning the semiconductor substrate 12 as described herein.

Figure 2:
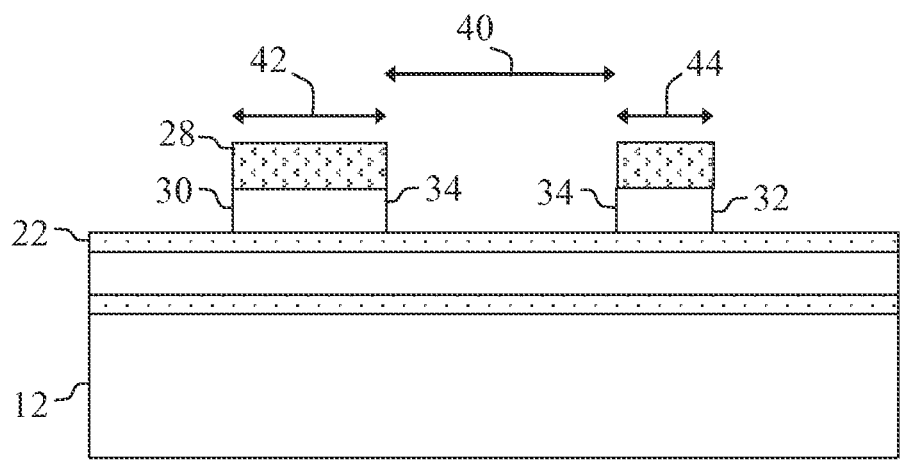

In FIG. 2, the masking layer 24 is exposed, developed or otherwise patterned in a lithographic process to form closed mask segments 28. The closed mask segments 28 selectively cover portions of the upper mandrel layer 20. An etch process is performed to etch exposed portions of the upper mandrel layer 20. In an exemplary embodiment, a reactive ion etch (RIE) is performed to etch the exposed portions of the upper mandrel layer 20. The etch process stops on the hard mask layer 22. As a result, upper mandrels including a first upper mandrel 30 and a second upper mandrel 32 are formed overlying the hard mask layer 22. Exemplary upper mandrels 30 and 32 are formed with substantially vertical sidewalls 34. As shown, the first upper mandrel 30 and the second upper mandrel 32 are separated from one another by a distance indicated by double headed arrow 40. Further, the first upper mandrel 30 has a critical dimension indicated by double headed arrow 42 and the second mandrel 30 has a critical dimension indicated by double headed arrow 44. In the exemplary embodiment, the first critical dimension 42 is not equal to the second critical dimension 44. Further, in the exemplary embodiment, the distance 40 is not equal to the first critical dimension 42 or the second critical dimension 44. As described below, providing upper mandrels having varied critical dimensions and separated by non-uniform distances allow for formation of variably spaced structures via self-aligned quadruple patterning. It is noted that a plurality of first upper mandrels 30 and/or second upper mandrels 32 may be formed and separated by uniform or variable distances as desired. For example, first upper mandrels 30 may be formed having uniform critical dimensions 42 and separated by uniform distances.

Figure 3:
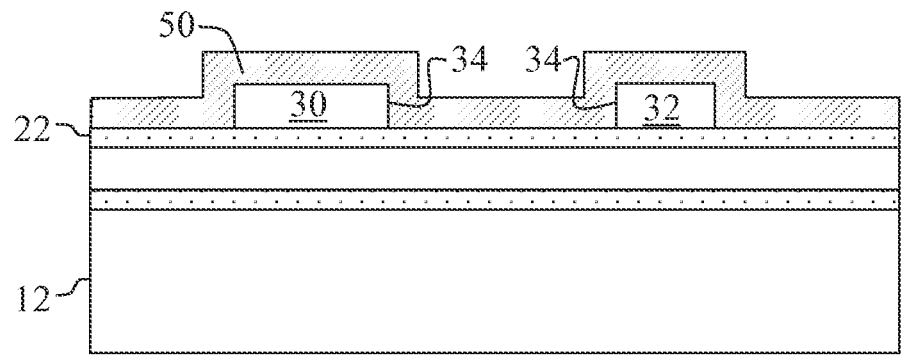

The method may continue in FIG. 3 with the removal of the closed mask segments 28 and the formation of a spacer-forming layer 50 over the upper hard mask layer 22, the first upper mandrel 30 and the second upper mandrel 32. An exemplary spacer-forming layer 50 is conformally deposited such as by atomic layer deposition (ALD), plasma-enhanced chemical vapor deposition, a low pressure chemical vapor deposition, or another chemical vapor deposition process. An exemplary spacer-forming layer 50 contacts the upper hard mask layer 22 and the sidewalls 34 of the upper mandrels 30 and 32 and encapsulates the upper mandrels 30 and 32. Spacer-forming layer 50 may be formed of silicon nitride, silicon dioxide, or any type of organic or inorganic material having etch selectivity with respect to upper mandrels 30 and 32.

Figure 4:
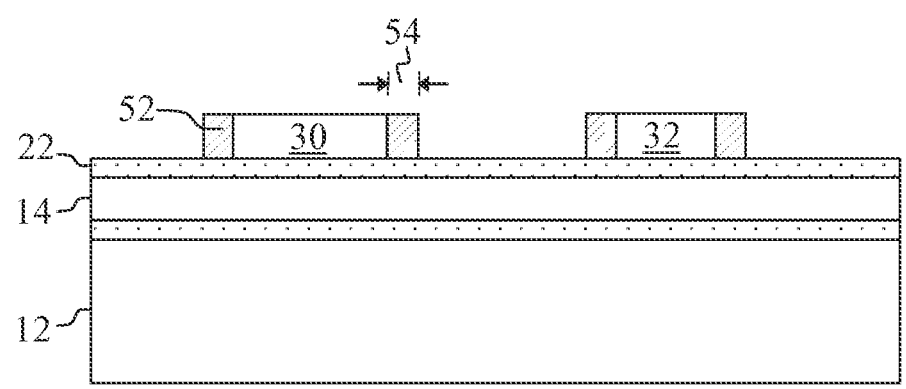

The spacer-forming layer 50 is etched to form upper sidewall spacers 52 in FIG. 4. An exemplary etch uses an RIE process with chemistries based upon $CHF_3/O_2$ to etch silicon nitride, and $CHF_3$ or $CF_4$ to etch silicon oxynitride or silicon oxide. The upper sidewall spacers 52 are formed with a critical dimension indicated by arrows 54. In an exemplary embodiment, the critical dimension 54 is about 14 nm to about 30 nm. As shown, the upper sidewall spacers 52 surround each upper mandrel 30 and 32. In an exemplary embodiment, an etch is performed followed by planarization of both upper mandrels 30 and 32 and upper sidewall spacers 52.

Figure 5:
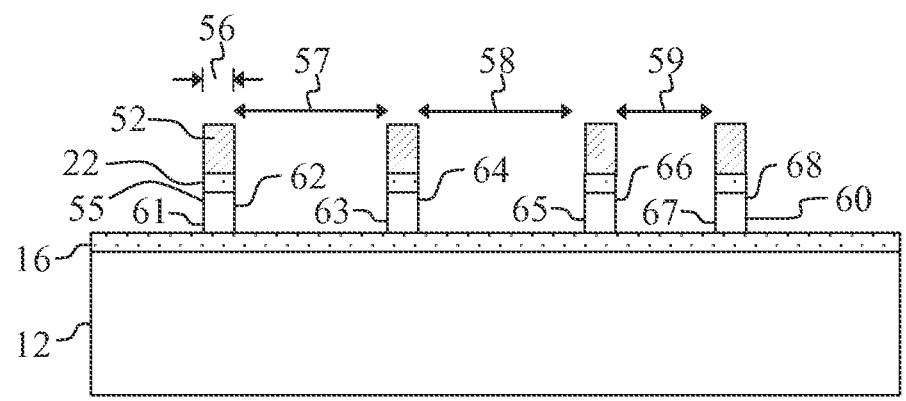

As illustrated in FIG. 5, the upper mandrels 30 and 32 are removed, leaving the upper sidewall spacers 52 on the upper hard mask layer 22. In an exemplary embodiment, the upper mandrels 30 and 32 are removed by a reactive ion etch selective to the upper mandrels 30 and 32 in relation to the upper sidewall spacers 52 and the upper hard mask layer 22. Then, the exposed portions of the upper hard mask layer 22 and the lower mandrel layer 14, i.e., those portions not directly underlying the upper sidewall spacers 52, are etched. For example, an anisotropic etch may be performed by a timed reactive ion etch process selective to the hard mask layer 22 and lower mandrel layer 14. As a result, lower mandrels 55 are formed from the lower mandrel layer 14 overlying the first hard mask layer 16. As shown, the lower mandrels 55 have a uniform critical dimension, indicated by arrows 56, equal to or less than the critical dimension 54 of the upper sidewall spacers 52. Further, the lower mandrels 55 are separated from one another by distances indicated by double-headed arrows 57, 58, and 59. Distance 57 is equal to critical dimension 42 (see FIG. 2); distance 58 is equal to distance 40 (see FIG. 2) minus (equal to or less than) twice the critical dimension 54 (see FIG. 5); and distance 59 is equal to critical dimension 44 (see FIG. 2). In the exemplary embodiment, distances 57, 58 and 59 are not equal, though it is contemplated that in certain embodiments distance 57 equals distance 58, distance 58 equals distance 59, and/or distance 57 equals distance 59. As shown, the lower mandrels 55 are formed with substantially vertical sidewalls, collectively numbered 60 and individually identified as 61, 62, 63, 64, 65, 66, 67 and 68.

Figure 6:
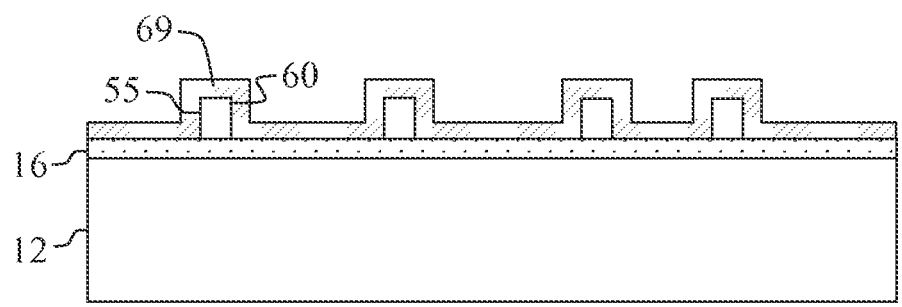

In an exemplary embodiment, the method continues, as illustrated in FIG. 6, with the removal of the etched portions of the upper hard mask layer 22 and upper sidewall spacers 52 from the lower mandrels 55. Then, a spacer-forming layer 69 is formed over the lower hard mask layer 16 and the lower mandrels 55. An exemplary spacer-forming layer 69 is conformally deposited such as by atomic layer deposition, plasma-enhanced chemical vapor deposition, a low pressure chemical vapor deposition, or another chemical vapor deposition process. An exemplary spacer-forming layer 69 contacts the lower hard mask layer 16 and the sidewalls 60 of the lower mandrels 55 and encapsulates the lower mandrels 55. Spacer-forming layer 69 may be formed of silicon nitride, silicon dioxide, or any type of organic or inorganic material having etch selectivity with respect to lower mandrels 55.

Figure 7:
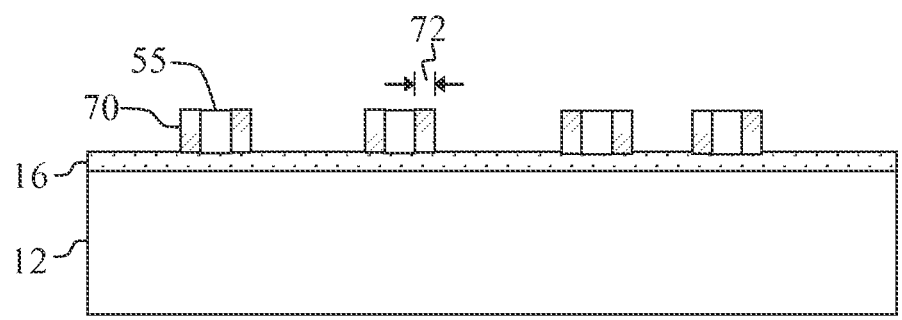

The spacer-forming layer 69 is etched to form lower sidewall spacers 70 in FIG. 7. An exemplary etch uses an RIE process with chemistries based upon $CHF_3/O_2$ to etch silicon nitride, and $CHF_3$ or $CF_4$ to etch silicon oxynitride or silicon oxide. The lower sidewall spacers 70 are formed with a critical dimension indicated by arrows 72. In an exemplary embodiment, the critical dimension 72 is about 10 nm to about 20 nm. As shown, the lower sidewall spacers 70 surround each lower mandrel 55. In an exemplary embodiment, an etch is performed followed by planarization of both lower mandrels 55 and lower sidewall spacers 70.

Figure 8:
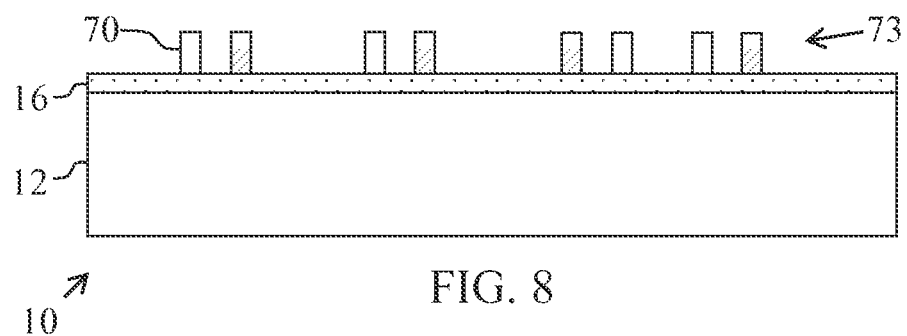

Next, the lower mandrels 55 are removed, leaving the lower sidewall spacers 70 on the lower hard mask layer 16, as illustrated in FIG. 8. In an exemplary embodiment, the lower mandrels 55 are removed by a reactive ion etch selective to the lower mandrels 55 in relation to the lower sidewall spacers 70 and the lower hard mask layer 16. The lower sidewall spacers 70 form the completed mask 73 for patterning the semiconductor substrate 12 to fabricate integrated circuit 10.

Figure 9:
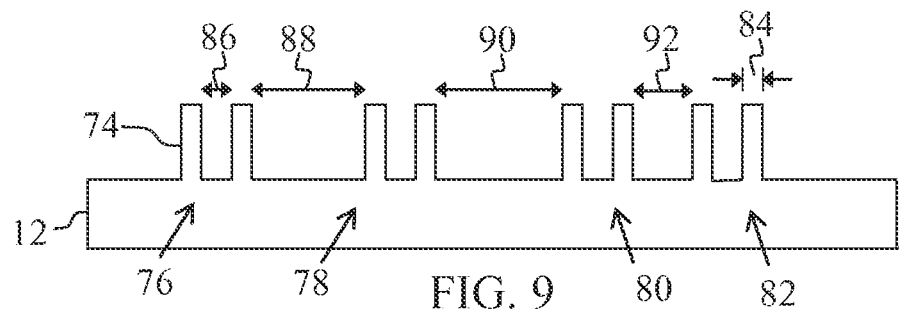

In FIG. 9, the exposed portions of the lower hard mask layer 16 and the semiconductor substrate 12, i.e., those portions not directly underlying the lower sidewall spacers 70, are etched. For example, an anisotropic etch may be performed by a timed reactive ion etch process selective to the lower hard mask layer 16 and semiconductor substrate 12. As a result, fin structures 74 are formed from the semiconductor substrate 12. As shown, the fin structures 74 are formed in adjacent pairs 76, 78, 80 and 82. The fin structures 74 are formed with a substantially uniform critical dimension, indicated by arrows 84, equal to or less than the critical dimension 72 of the lower sidewall spacers 70.

Within each pair 76, 78, 80, and 82, each fin structure 74 is separated from the other paired fin structure 74 by a uniform intra-pair distance indicated by double-headed arrow 86. Exemplary intra-pair distance 86 is equal to the critical dimension 56 of the lower mandrels 55 (see FIG. 5).

Pair 76 of fin structures 74 is separated from adjacent pair 78 of fin structures 74 by a distance indicated by double-headed arrow 88. Exemplary distance 88 is approximately equal to the critical dimension 42 of the first upper mandrel 30 (see FIG. 2) minus (equal to or less than) twice the critical dimension 72 of the lower sidewall spacers 70 (see FIG. 7)

Pair 78 of fin structures 74 is separated from adjacent pair 80 of fin structures 74 by a distance indicated by double-headed arrow 90. Exemplary distance 90 is equal to distance 40 (see FIG. 2) minus (equal to or less than) twice the critical dimension 56 of the upper sidewall spacers 55 (see FIG. 5) and in addition, minus (equal to or less than) twice the critical dimension 72 of the lower sidewall spacers 70 (see FIG. 7).

Pair 80 of fin structures 74 is separated from adjacent pair 82 of fin structures 74 by a distance indicated by double-headed arrow 92. Exemplary distance 92 is equal to the critical dimension 44 of the first upper mandrel 33 (see FIG. 2) minus (equal to or less than) twice the critical dimension 72 of the lower sidewall spacers 70 (see FIG. 7)

In an exemplary embodiment, distances 88, 90 and 92 are not equal to one another. However, in certain embodiments, distance 88 may equal distance 90 or 92, distance 90 may equal distance 88 or 92, or distance 92 may equal distance 88 or 90. During fabrication, desired values for dimensions or distances 84, 86, 88, 90, 92 may be achieved through adjusting the critical dimensions or distances 40, 42, 44, 56, and/or 72.

Figure 10:
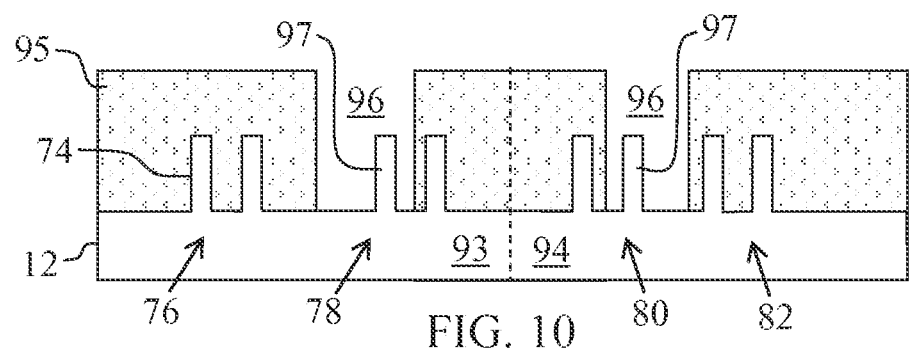
Figure 11:
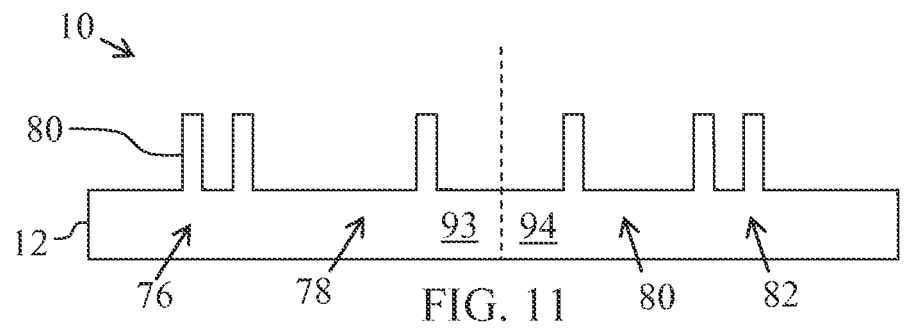

Further processing of the fin structures 74 is carried out in FIG. 10. In FIG. 10, the semiconductor substrate is shown to include a first SRAM cell area 93 and a second SRAM area 94. Pairs 76 and 78 of fin structures 74 are located in first SRAM cell area 93 and pairs 80 and 82 of fin structures 74 are located in second SRAM cell area 94. SRAM cell areas typically require two NMOS transistors and one PMOS transistor. Therefore, a fin structure 74 is etched from each of pair 78 and pair 80 to leave a remaining unpaired fin structure to form the PMOS transistor. As shown, a mask 95 is deposited over the fin structures 74 and is etched or otherwise patterned to form trenches 96 exposing selected fin structures 97. Then, an etch process such as a timed reactive ion etch is performed to remove the selected fin structures 97. The resulting semiconductor substrate 12 is shown in FIG. 11 after the mask 95 is removed.

After formation of the fin structures 74 as desired in the SRAM cell areas and in logic areas on the semiconductor substrate 12, further processing of the integrated circuit 10 may be performed, including the formation of gates, source/drain regions, stress material, contacts, and interconnect structures, as is known in integrated circuit fabrication.

The integrated circuit fabrication methods described herein provide for integrated circuits with variably spaced fin structures. Variable spacing of fin structures enables formation of both memory devices and logic devices on a semiconductor substrate. Specifically, memory devices requiring variably spaced fin structures may be formed simultaneously with the formation of uniformly spaced fin structures in logic areas and in NMOS portions of memory areas. As described herein, the variably spaced fin structures are provided with sub-lithographic dimensions through the use of a self-aligned quadruple patterning technique.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit, the method comprising:
   etching an upper mandrel layer to form upper mandrels, wherein at least one upper mandrel has a first critical dimension and at least one upper mandrel has a second critical dimension not equal to the first critical dimension;
   forming upper spacers adjacent the upper mandrels;
   etching a lower mandrel layer using the upper spacers as an etch mask to form lower mandrels;
   forming lower spacers adjacent the lower mandrels;
   removing the lower mandrels; and
   after removing the lower mandrels, etching a material using the lower spacers as an etch mask to form variably spaced structures.

2. The method of claim 1 wherein etching a material using the lower spacers as an etch mask to form variably spaced structures comprises etching a bulk semiconductor material using the lower spacers as an etch mask to form variably spaced semiconductor fin structures.

3. The method of claim 2 wherein etching the bulk semiconductor material using the lower spacers as an etch mask to form variably spaced semiconductor fin structures comprises forming a first pair of NMOS fin structures, a first pair of PMOS fin structures, a second pair of PMOS fin structures, and a second pair of NMOS fin structures.

4. The method of claim 3 wherein etching the bulk semiconductor material using the lower spacers as an etch mask to form variably spaced semiconductor fin structures comprises defining a uniform intra-pair distance between fin structures in each pair.

5. The method of claim 4 wherein etching the bulk semiconductor material using the lower spacers as an etch mask to form variably spaced semiconductor fin structures comprises defining an NMOS-PMOS distance between the first pair of NMOS fin structures and the first pair of PMOS fin structures, defining a PMOS-PMOS distance between the first pair of PMOS fin structures and the second pair of PMOS fin structures, and defining a PMOS-NMOS distance between the second pair of PMOS fin structures and the second pair of NMOS fin structures, wherein the NMOS-PMOS distance is not equal to the PMOS-NMOS distance.

6. The method of claim 5 further comprising:
   etching one of the PMOS fin structures from the first pair of PMOS fin structures to define a first SRAM area including the first pair of NMOS fin structures and a remaining PMOS fin structure in the first pair of PMOS fin structures; and
   etching one of the PMOS fin structures from the second pair of PMOS fin structures to define a second SRAM area including the second pair of NMOS fin structures and a remaining PMOS fin structure in the second pair of PMOS fin structures.

7. The method of claim 1 wherein etching the lower mandrel layer using the upper spacers as an etch mask to form lower mandrels comprises forming the lower mandrels with sidewalls, and wherein forming the lower spacers adjacent the lower mandrels comprises forming the lower spacers on the sidewalls of the lower mandrels.

8. The method of claim 1 wherein forming lower spacers comprises depositing a spacer-forming layer over and adjacent the lower mandrels, and planarizing the spacer-forming layer to expose the lower mandrels.

9. The method of claim 1 wherein forming upper spacers comprises forming upper spacers having a first uniform critical dimension, and wherein forming lower spacers comprises forming lower spacers having a second uniform critical dimension not equal to the first uniform critical dimension.

10. A method for fabricating an integrated circuit, the method comprising:
   providing a upper mandrel layer overlying a lower mandrel layer overlying a semiconductor material; and
   performing a self-aligned quadruple patterning (SAQP) process to form variably spaced semiconductor fin structures from the semiconductor material including:
      etching the upper mandrel layer to form a first upper mandrel having sidewalls and distanced from a second upper mandrel having sidewalls, wherein the first upper mandrel has a first critical dimension and wherein the first upper mandrel is distanced from the second upper mandrel by a second critical dimension not equal to the first critical dimension;

forming upper spacers adjacent the sidewalls of the upper mandrels;

removing the upper mandrels;

etching the lower mandrel layer using the upper spacers as an etch mask to form lower mandrels having sidewalls;

after forming the lower mandrels, forming lower spacers adjacent the sidewalls of the lower mandrels;

removing the lower mandrels; and etching the semiconductor material using the lower spacers as an etch mask to form the variably spaced semiconductor fin structures.

11. The method of claim 10 wherein etching the semiconductor material using the lower spacers as an etch mask to form the variably spaced semiconductor fin structures comprises forming a first pair of NMOS fin structures, a first pair of PMOS fin structures, a second pair of PMOS fin structures, and a second pair of NMOS fin structures.

12. The method of claim 11 wherein etching the semiconductor material using the lower spacers as an etch mask to form the variably spaced semiconductor fin structures comprises defining a uniform intra-pair distance between fin structures in each pair.

13. The method of claim 12 wherein etching the semiconductor material using the lower spacers as an etch mask to form the variably spaced semiconductor fin structures comprises:

defining an NMOS-PMOS distance between the first pair of NMOS fin structures and the first pair of PMOS fin structures;

defining a PMOS-PMOS distance between the first pair of PMOS fin structures and the second pair of PMOS fin structures; and defining a PMOS-NMOS distance between the second pair of PMOS fin structures and the second pair of NMOS fin structures, wherein the NMOS-PMOS distance is not equal to the PMOS-PMOS distance.

14. The method of claim 13 further comprising:

etching one of the PMOS fin structures from the first pair of PMOS fin structures to define a first SRAM area including the first pair of NMOS fin structures and a remaining PMOS fin structure in the first pair of PMOS fin structures; and etching one of the PMOS fin structures from the second pair of PMOS fin structures to define a second SRAM area including the second pair of NMOS fin structures and a remaining PMOS fin structure in the second pair of PMOS fin structures.

15. The method of claim 10 wherein forming lower spacers adjacent the sidewalls of the lower mandrels comprises forming lower spacers on the sidewalls of the lower mandrels.

16. The method of claim 10 wherein etching the semiconductor material using the lower spacers as an etch mask comprises etching the semiconductor material using the lower spacers as an etch mask after removing the lower mandrels.

17. The method of claim 10 wherein forming upper spacers comprises forming upper spacers having a first uniform critical dimension, and wherein forming lower spacers comprises forming lower spacers having a second uniform critical dimension not equal to the first uniform critical dimension.

18. A method for forming a mask for fabricating an integrated circuit, the method comprising:

etching an upper mandrel layer to form upper mandrels having sidewalls, wherein a first upper mandrel has a first critical dimension and a second upper mandrel has a second critical dimension not equal to the first critical dimension;

forming upper spacers adjacent the sidewalls of the upper mandrels;

removing the upper mandrels;

etching a lower mandrel layer using the upper spacers as an etch mask to form lower mandrels;

forming lower spacers adjacent the lower mandrels; and selectively removing the lower mandrels, wherein after selectively removing the lower mandrels the lower spacers define a mask for forming variably spaced structures.

19. The method of claim 18 wherein forming upper spacers comprises forming upper spacers having a uniform critical dimension; forming lower spacers comprises forming a first pair of outer lower spacers, a first pair of inner lower spacers, a second pair of inner lower spacers, and a second pair of outer lower spacers, wherein the lower spacers have a uniform critical dimension and wherein a uniform intra-pair distance is defined between lower spacers in each pair.

20. The method of claim 19 wherein forming lower spacers adjacent the lower mandrels comprises:

defining a first distance between the first pair of outer lower spacers and the first pair of inner lower spacers;

defining a second distance between the first pair of inner lower spacers and the second pair of inner lower spacers; and defining a third distance between the second pair of inner lower spacers and the second pair of outer lower spacers, wherein the first distance, the second distance and the third distance are not equal.

* * * * *